United States Patent
Eo et al.

(10) Patent No.: US 9,437,761 B2
(45) Date of Patent: Sep. 6, 2016

(54) METHOD OF FORMING CHALCOPYRITE LIGHT-ABSORBING LAYER

(71) Applicant: KOREA INSTITUTE OF ENERGY RESEARCH, Daejeon (KR)

(72) Inventors: Young Joo Eo, Daejeon (KR); Kyung Hoon Yoon, Daejeon (KR); SeJin Ahn, Daejeon (KR); Jihye Gwak, Daejeon (KR); Jae Ho Yun, Daejeon (KR); Ara Cho, Seoul (KR); Kee Shik Shin, Daejeon (KR); SeoungKyu Ahn, Daejeon (KR); Jun Sik Cho, Daejeon (KR); Jin Su Yoo, Seoul (KR); Sang Hyun Park, Daejeon (KR); Joo Hyung Park, Daejeon (KR)

(73) Assignee: KOREA INSTITUTE OF ENERGY RESEARCH (KR)

( * ) Notice: Subject to any disclaimer, the term of this patent is extended or adjusted under 35 U.S.C. 154(b) by 0 days.

(21) Appl. No.: 14/780,048

(22) PCT Filed: Apr. 1, 2014

(86) PCT No.: PCT/KR2014/002791
§ 371 (c)(1),
(2) Date: Sep. 25, 2015

(87) PCT Pub. No.: WO2014/163378
PCT Pub. Date: Oct. 9, 2014

(65) Prior Publication Data
US 2016/0049533 A1    Feb. 18, 2016

(30) Foreign Application Priority Data

Apr. 2, 2013 (KR) .......................... 10-2013-0035753

(51) Int. Cl.
*H01L 21/00*    (2006.01)
*H01L 31/032*   (2006.01)
(Continued)

(52) U.S. Cl.
CPC ....... *H01L 31/0322* (2013.01); *H01L 31/0445* (2014.12); *H01L 31/18* (2013.01); *Y02E 10/541* (2013.01)

(58) Field of Classification Search
CPC    H01L 31/0322; H01L 31/0445; H01L 31/18
USPC .......................................... 438/95, 308, 486
See application file for complete search history.

(56) References Cited

U.S. PATENT DOCUMENTS 8,742,253 B1 *   6/2014   Menezes ............. H01L 31/0322
                                                                136/263
2008/0115827 A1   5/2008   Woods et al.
(Continued)

FOREIGN PATENT DOCUMENTS

KR    100977529    8/2010
KR    101144807    5/2012
(Continued)

OTHER PUBLICATIONS

International Search Report (ISR) and Written Opinion; PCT/KR2014/002791; Apr. 1, 2014 (11 Pages).

*Primary Examiner* — Kevin M Picardat
(74) *Attorney, Agent, or Firm* — Mark E. Bandy; Rankin, Hill & Clark LLP

(57) ABSTRACT

Disclosed is a method of forming a chalcopyrite light-absorbing layer for a solar cell, including: forming a thin film including a chalcopyrite compound precursor; and radiating light on the thin film, wherein the chalcopyrite compound precursor absorbs light energy and is thus crystallized. When forming the chalcopyrite light-absorbing layer, light, but not heat, is applied, thus preventing problems, including damage to a substrate due to heat and formation of $MoSe_2$ due to heating of the Mo rear electrode. Furthermore, long-wavelength light, which deeply penetrates the thin film, is first radiated, and short-wavelength light, which shallowly penetrates the thin film, is subsequently radiated, thereby sequentially forming the chalcopyrite light-absorbing layer from the bottom of the thin film.

10 Claims, 3 Drawing Sheets

(51) Int. Cl.
*H01L 31/0445* (2014.01)
*H01L 31/18* (2006.01)

(56) References Cited

U.S. PATENT DOCUMENTS

2008/0283389 A1* 11/2008 Aoki .................. H01L 31/0322
                                                    204/192.15

2010/0317144 A1    12/2010  Basol
2012/0193349 A1     8/2012  Callahan

FOREIGN PATENT DOCUMENTS

| KR | 101168706  | 7/2012  |
| WO | 2012071287 | 5/2012  |
| WO | 2012148621 | 11/2012 |

* cited by examiner

METHOD OF FORMING CHALCOPYRITE LIGHT-ABSORBING LAYER

BACKGROUND OF THE INVENTION

1. Field of the Invention

The present invention relates to a light-absorbing layer for a solar cell, and more particularly, to a chalcopyrite light-absorbing layer for a solar cell.

2. Description of the Related Art

Recently, the development of next-generation clean energy is regarded as important because of serious environmental pollution problems and the exhaustion of fossil energy. Since solar cells, which are a device for directly converting solar power into electric energy, generate less pollution, tap an unlimited resource, and have an almost unlimited lifetime, they are expected to be an energy source that is able to solve the energy problems in future.

Solar cells are variously classified depending on the type of material used for the light-absorbing layer. At present, the most widely used is a silicon (Si) solar cell. However, as the price of Si is drastically increasing due to the shortage thereof, solar cells that use compound semiconductors are receiving attention. Compound semiconductors are particularly useful for manufacturing thin film-type solar cells, can be used in small amounts, and are lightweight, and thus are widely applicable.

Generally, a Group I-III-VI2 chalcopyrite compound semiconductor, for example, $CuInSe_2$, has a direct transition-type energy band gap, and possesses a light absorption coefficient of $1 \times 10^5$ cm$^{-1}$, which is the highest among semiconductors, thus making it possible to manufacture a high-efficiency solar cell using a thin film having a thickness of 1 to 2 μm and exhibiting outstanding long-term electro-optical stability.

Hence, the chalcopyrite compound semiconductor is receiving attention as an inexpensive high-efficiency solar cell material, which may drastically improve the profitability of photovoltaic power generation, in lieu of currently available crystalline Si, which is expensive.

In order to adjust the band gap of $CuInSe_2$ from 1.04 eV to within the range from 1.2 to 1.4 eV, which is ideal, a portion of indium (In) is substituted with gallium (Ga) and a portion of selenium (Se) is substituted with sulfur (S). For reference, the band gaps of $CuGaSe_2$ and $CuGaS_2$ are 1.6 eV and 2.5 eV, respectively.

The quinary compound, in which a portion of In is substituted with Ga and a portion of Se is substituted with S, is represented by CIGSS [$Cu(In_xGa_{1-x})(Se_yS_{1-y})_2$], and may be representatively expressed as CIS or CIGS.

A CIGS light-absorbing layer may be formed using a co-evaporation process. The co-evaporation process is performed by simultaneously evaporating unit elements, for example, copper (Cu), indium (In), gallium (Ga) and selenium (Se), using heat evaporation sources, so that a CIGS thin film is directly formed on a substrate at high temperature. Since individual evaporation sources are independently used, it is easy to control the elemental composition, making it possible to form a CIGS light-absorbing layer having excellent performance. The CIGS solar cells that exhibit the greatest efficiency to date are manufactured through the above process.

In addition, a thin film composed of a precursor material for a CIGS thin film may be formed using sputtering or another deposition process, followed by heat treatment or selenization in a Se or $H_2Se$ gas atmosphere.

With the goal of solving the problems of the aforementioned methods, which require an expensive vacuum process, thorough research is ongoing into a non-vacuum process, in which a slurry or ink containing a CIGS precursor material or CIGS compound nanoparticles is prepared, applied on a substrate and then thermally treated.

These days, CZTS ($Cu_2ZnSn(Se_{1-x}S_x)_4$) solar cells, in which In and Ga of a CIGS light-absorbing layer are substituted with Zn and Sn and which are thus composed of Group I-II-IV-VI elements, which are favorable in terms of material costs and environmental impact, are under active study. The process of manufacturing a CZTS light-absorbing layer for a solar cell is almost the same as the process of manufacturing the CIGS light-absorbing layer. Below, the CIS compound, the CIGS compound and the CZTS compound are defined together as a chalcopyrite compound.

Although heating or heat treatment is required in all of the aforementioned methods of manufacturing the chalcopyrite light-absorbing layer, it is disadvantageous because a substrate, especially a flexible substrate, may be damaged due to such heat.

Recently, chalcopyrite solar cells using molybdenum (Mo) as rear electrodes have become predominant. However, when a chalcopyrite light-absorbing layer is formed on the Mo rear electrode disposed on the substrate, $MoSe_2$ may be excessively produced at the interface between the Mo rear electrode and the light-absorbing layer, attributable to excessive heat treatment, undesirably deteriorating the efficiency of solar cells.

SUMMARY OF THE INVENTION

Accordingly, the present invention has been made keeping in mind the above problems encountered in the related art, and an object of the present invention is to provide a method of forming a chalcopyrite light-absorbing layer for a solar cell without the problems related to heat by using light, rather than heat, in the course of forming the chalcopyrite light-absorbing layer.

In order to accomplish the above object, the present invention provides a method of forming a chalcopyrite light-absorbing layer for a solar cell, comprising: forming a thin film including a chalcopyrite compound precursor; and radiating light on the thin film, wherein the chalcopyrite precursor absorbs light energy and is thus crystallized.

As used herein, the term "light" refers to electromagnetic waves corresponding to the wavelength ranges of IR light, visible light, and UV light.

Also, the present invention provides a method of forming a chalcopyrite light-absorbing layer for a solar cell, comprising: co-evaporating elements for a chalcopyrite compound, thus forming a chalcopyrite precursor thin film; and radiating light on the chalcopyrite precursor thin film, wherein the chalcopyrite precursor thin film absorbs light energy and is thus crystallized.

In the present invention, when the elements for the chalcopyrite compound are evaporated and deposited, a chalcopyrite precursor thin film is formed without applying heat to the substrate, after which light is radiated on the chalcopyrite precursor thin film to thereby form the chalcopyrite light-absorbing layer, thus solving the problem of applying thermal impact to the substrate.

Also, the present invention provides a method of forming a chalcopyrite light-absorbing layer for a solar cell, comprising: forming a chalcopyrite precursor thin film including a chalcopyrite compound precursor using sputtering; and radiating light on the chalcopyrite precursor thin film, wherein the chalcopyrite compound precursor absorbs light energy and is thus crystallized.

Also, the present invention provides a method of forming a chalcopyrite light-absorbing layer for a solar cell, comprising: applying a solution or slurry including a chalcopyrite compound precursor in a non-vacuum; and radiating light on the applied solution or slurry, wherein the precursor absorbs light energy and is thus crystallized.

The present inventors have devised a method of applying light, but not heat, in order to solve problems including damage to a substrate due to heat applied upon the formation of the chalcopyrite light-absorbing layer and the formation of $MoSe_2$ at the interface with the Mo rear electrode.

According to the present invention, only the chalcopyrite compound precursor or the chalcopyrite precursor thin film may absorb light energy to thus form the chalcopyrite compound, without thoroughly heating the inside of the apparatus as in conventional heat treatment procedures.

To this end, radiating the light in the present invention may be performed by simultaneously or sequentially radiating two or more light rays having different wavelength ranges. Upon sequentially radiating two or more light rays having different wavelength ranges, the light rays are preferably radiated in the sequence from a relatively long wavelength to a relatively short wavelength.

In order to facilitate the absorption of light energy into the precursor thin film, light rays having a variety of wavelengths may be simultaneously or sequentially radiated. When such light rays are sequentially radiated, it is preferred that long-wavelength light, having high penetration ability, be first radiated, and that short-wavelength light, having low penetration ability, be radiated thereafter.

Furthermore, radiating the light may be carried out in a Se or $H_2Se$ gas atmosphere. As such, radiating the light replaces selenization.

According to the present invention, light is radiated only on a chalcopyrite compound precursor or a precursor thin film in the course of forming a chalcopyrite light-absorbing layer, thereby effectively forming a chalcopyrite light-absorbing layer without problems of damaging a substrate due to heat.

Also, because light is radiated only on the chalcopyrite compound precursor or the precursor thin film in the course of forming the chalcopyrite light-absorbing layer, there is no problem of forming $MoSe_2$ due to heating of a Mo rear electrode.

Furthermore, long-wavelength light, which deeply penetrates the thin film, is first radiated, and short-wavelength light, which shallowly penetrates the thin film, is then radiated, thereby densely sequentially forming a chalcopyrite light-absorbing layer from the bottom of the thin film.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
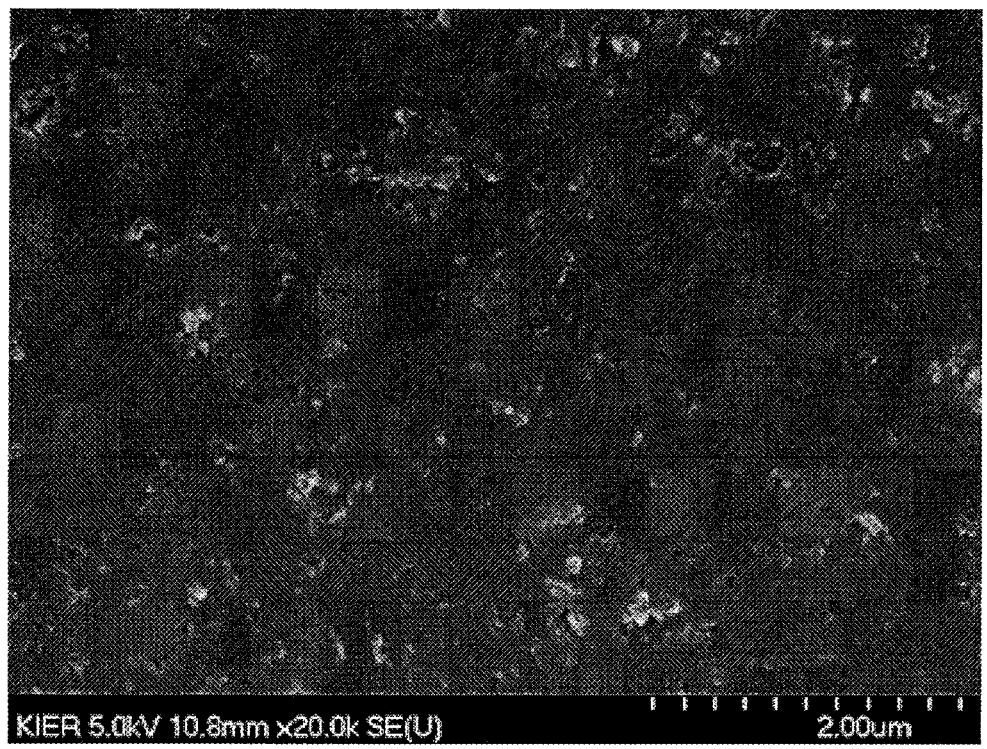
FIG. 1 is a microscope image illustrating the surface of a CIGS precursor layer formed using a non-vacuum process.

According to the present invention, when heat treatment or selenization is performed in the course of forming a chalcopyrite light-absorbing layer for a solar cell, heat is not applied to the entirety thereof, but light is radiated on a chalcopyrite compound precursor and a chalcopyrite precursor thin film. As used herein, the term "chalcopyrite" refers to a chalcopyrite compound for use in a light-absorbing layer for a solar cell, including a CIS compound, a CIGS compound, a CZTS compound, etc., and the term "chalcopyrite precursor thin film" refers to a thin film in which no chalcopyrite compound is formed. As also used herein, the term "light" refers to electromagnetic waves corresponding to the wavelength ranges of IR light, visible light, and UV light.

In the present invention, only a chalcopyrite compound precursor and a chalcopyrite precursor thin film may absorb light energy to thereby form a chalcopyrite compound light-absorbing layer. As such, other portions, including a substrate and a rear electrode, are not heated.

According to the present invention, as described below, in a method of forming a chalcopyrite light-absorbing layer which involves heat treatment or selenization in a single step, light may be radiated in lieu of the heat treatment or selenization step. Furthermore, in a method of forming a chalcopyrite light-absorbing layer involving heat treatment or selenization in multiple steps, light may be radiated in lieu of all or some of the heat treatment or selenization steps.

In the present invention, elements for a chalcopyrite compound are co-evaporated, thus forming a chalcopyrite precursor thin film on which light is then radiated, yielding a light-absorbing layer.

Typically, a co-evaporation process is performed in a manner such that, in the course of individually evaporating elements for a chalcopyrite light-absorbing layer using heat evaporation sources to deposit them on a substrate or a Mo rear electrode on the substrate, a high temperature is applied to the substrate, thereby forming a chalcopyrite compound thin film in coincidence with the deposition process. In contrast, in the present invention, when elements for a chalcopyrite light-absorbing layer are evaporated at a stoichiometric ratio and deposited, a chalcopyrite precursor thin film is formed without applying heat to the substrate, after which light is radiated on the chalcopyrite precursor thin film, thereby forming a chalcopyrite light-absorbing layer from the chalcopyrite precursor thin film. In the present invention, the process of depositing elements for a chalcopyrite compound using co-evaporation is not particularly limited, with the exception that a high temperature is applied to the substrate, and any method therefor may be applied.

Particularly, light is radiated immediately after the formation of a chalcopyrite precursor thin film corresponding to a desired chalcopyrite compound composition, whereby only crystallization may be carried out. Alternatively, a chalcopyrite precursor thin film may be formed using a composition requiring additional selenization or sulfurization, and light may then be radiated on the chalcopyrite precursor thin film in the selenization or sulfurization process.

The selenization or sulfurization process is conducted by radiating light on the chalcopyrite precursor thin film in a gas atmosphere containing Se or S, so that the Se or S element may penetrate the light-absorbing layer to form a chalcopyrite compound. In the selenization or sulfurization process incorporated in the present invention, a typical selenization or sulfurization process may be applied, with the exception that light is radiated only on the chalcopyrite precursor thin film.

In addition, a method of forming a chalcopyrite light-absorbing layer according to the present invention includes forming a chalcopyrite precursor thin film using sputtering, and then radiating light thereon, in lieu of heat treatment or selenization, thereby forming a chalcopyrite light-absorbing layer.

The formation of the chalcopyrite precursor thin film using sputtering is not particularly limited, and any method therefor may be applied.

Selenization is a process of applying heat in a gas atmosphere containing Se, so that the Se element penetrates the light-absorbing layer to thus form a chalcopyrite compound. In the present invention, a typical selenization process may be performed, with the exception that light, rather than heat, is applied.

Although the formation of the precursor thin film using typically useful sputtering is described herein, any other process such as physical vapor deposition (PVD) or chemical vapor deposition (CVD) may be utilized, in place of sputtering.

In addition, a light-absorbing layer according to the present invention may be formed by applying ink containing a chalcopyrite compound precursor and then radiating light thereon.

Particularly, ink containing a chalcopyrite precursor having a desired composition is applied, and then light is radiated thereon, thus promoting the crystallization thereof, and light may be radiated upon additional selenization or sulfurization.

Upon selenization or sulfurization, light is radiated in a gas atmosphere containing Se or S, whereby the Se or S element penetrates the light-absorbing layer, thus forming a chalcopyrite compound. In the present invention, selenization or sulfurization may be performed using a typical selenization or sulfurization process, with the exception that light is radiated only on the applied ink.

Although the application of ink containing a typically useful chalcopyrite compound precursor is described herein, any process of forming a precursor thin film in a non-vacuum may be applied, in place thereof.

As mentioned above, when light is radiated only on the chalcopyrite precursor thin film or the applied ink, in lieu of applying heat to the entire substrate or apparatus as in the conventional formation of a chalcopyrite light-absorbing layer, the thin film or the ink absorbs light energy and thus exhibits heat treatment effects, without any influence on the substrate or the Mo rear electrode.

In the present invention, the radiated light may be generated from a single light source having a wide wavelength range, but light rays generated from two or more light sources having different wavelength ranges may be radiated together.

In another method of the present invention, two or more light rays having different wavelength ranges may be sequentially radiated. Preferably, long-wavelength light, having high penetration ability, is first radiated, and then short-wavelength light, having low penetration ability, is subsequently radiated.

Particularly, when light is radiated on the applied ink containing the precursor material in a non-vacuum process, the long-wavelength light is first radiated, whereby the chalcopyrite compound thin film is sequentially formed from the bottom of the applied ink, thus effectively minimizing the amount of remaining carbon.

The operations and effects of the present invention are described through the following examples.

Formation of CIGS Precursor Layer Using Non-Vacuum Process

A CIGS precursor layer is first formed on the surface of a Mo electrode using a non-vacuum process.

Among various methods of forming precursor films, a non-vacuum process, that is, a process of forming a CIGS precursor layer by applying a slurry containing a chalcopyrite precursor, is adopted.

In a glove box, 0.343 g of CuI, 0.673 g of $InI_3$, and 0.207 g of $GaI_3$ were mixed with 30 ml of a distilled pyridine solvent, and the mixture was stirred for about 30 min on a hot plate at 100° C. After stirring for about 10 min, the opaque solution became clear, and the Cu—In mixture was mixed with 0.48 g of $Na_2Se$ dissolved in 20 ml of distilled methanol. This atomic ratio corresponds to Cu:In:Ga:Se=0.9:0.68:0.23:1.91.

Subsequently, the methanol/pyridine mixture was reacted for 1 min with mechanical stirring in an ice bath at 0° C., thus synthesizing a CIGS colloid. The synthesized CIGS colloid was centrifuged at 4000 rpm for about 30 min, sonicated for 5 min, and washed with distilled methanol, after which these procedures were repeated, thus thoroughly removing byproducts and pyridine from the product, yielding high-purity Cu—In—Ga—Se nanoparticles.

Subsequently, 0.3 g of the Cu—In—Ga—Se nanoparticles, 0.3 g of a chelating agent, 0.3 g of ethylene glycol, 1.2 g of methanol, 0.03 g of sulfone amide as a low-temperature flux, and a small amount of water as a solvent for the low-temperature flux were mixed together and then sonicated for 60 min, thus preparing a slurry.

Thereafter, the slurry was applied using a spin-coating process on a sodalime glass substrate having a Mo electrode deposited thereon. Here, the rotational speed of the glass substrate was 800 rpm, and the rotation time was set to 20 sec. After the coating process, three-stage drying was performed on a hot plate. Specifically, primary drying at 60° C. for 5 min, secondary drying at 200° C. for 2 min, and tertiary drying at 300° C. for 10 min were carried out.

Figure 2:
FIG. 2 is a microscope image illustrating the cross-section of the CIGS precursor layer formed using a non-vacuum process.

FIGS. 1 and 2 are respective microscope images illustrating the surface and the cross-section of the CIGS precursor layer formed using a non-vacuum process.

As illustrated in the images, the CIGS precursor layer formed on the surface of the Mo electrode was dried under the condition that it was not crystallized.

Formation of CIGS Light-Absorbing Layer by Radiating Light

Light is radiated on the CIGS precursor layer formed using a non-vacuum process, which is not crystallized, thereby crystallizing a thin film while forming CIGS.

In order to evaluate the effects of the formation of CIGS depending on the wavelength of radiated light, only short-wavelength light in the range of 300 to 600 nm was radiated.

Figure 3:
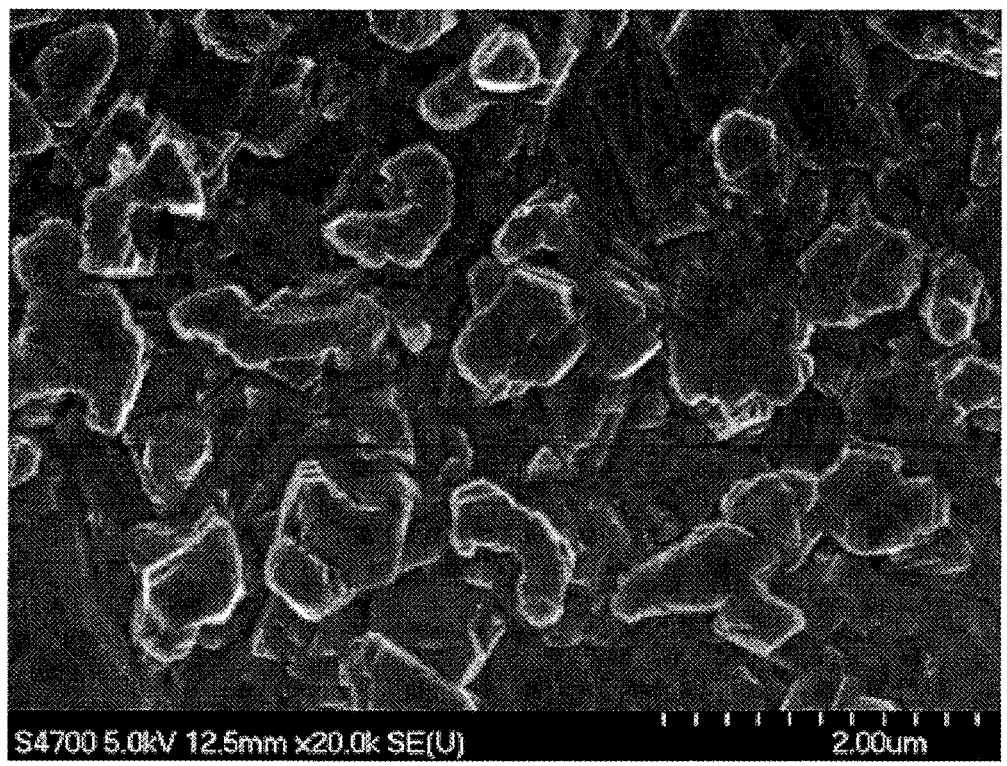
FIG. 3 is a surface image illustrating the results of radiation of short-wavelength light on the CIGS precursor layer formed using a non-vacuum process.
Figure 4:
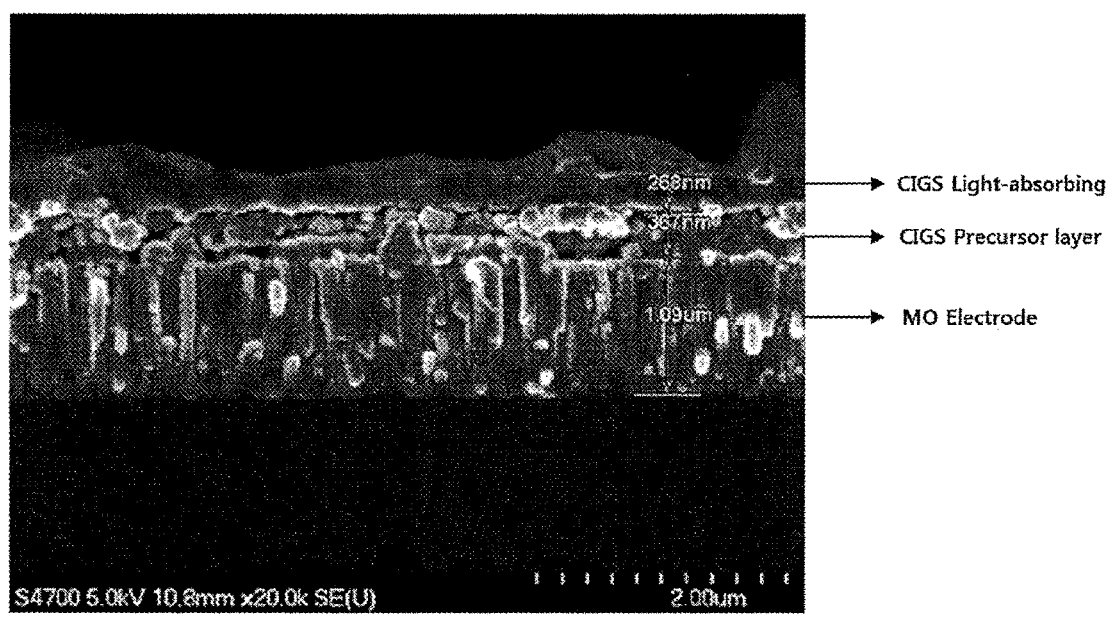
FIG. 4 is a cross-sectional image illustrating the results of radiation of short-wavelength light on the CIGS precursor layer formed using a non-vacuum process.

FIGS. 3 and 4 are respective images illustrating the surface and the cross-section of the GIGS precursor layer formed using a non-vacuum process, on which the short-wavelength light is radiated.

As illustrated in the surface image of FIG. 3, the surface of the GIGS precursor layer was crystallized by radiating the short-wavelength light.

As illustrated in the cross-sectional image of FIG. 4, the GIGS precursor layer had two layers, that is, the upper and the lower layer, particularly the upper layer having a thickness of 268 nm and the lower layer having a thickness of 367 nm. Based on the results of analysis of the components of the two layers, the upper layer was crystallized to form a GIGS light-absorbing layer, but the lower layer was not efficiently crystallized and was thus maintained in the form of a GIGS precursor.

Furthermore, the surface of the CIGS light-absorbing layer having grown crystals was rough and exhibited a large crystal phase, as shown in FIG. 3. Hence, it can be seen that the short-wavelength light enables the GIGS precursor layer to be rapidly crystallized, but limitations are imposed on the penetration depth, making it difficult to thoroughly crystallize the GIGS precursor layer thicker than the penetration depth of the short-wavelength light.

Next, on the surface of the same GIGS precursor layer, long-wavelength light at 600 to 1000 nm was first radiated, and then short-wavelength light at 300 to 600 nm was radiated.

Figure 5:
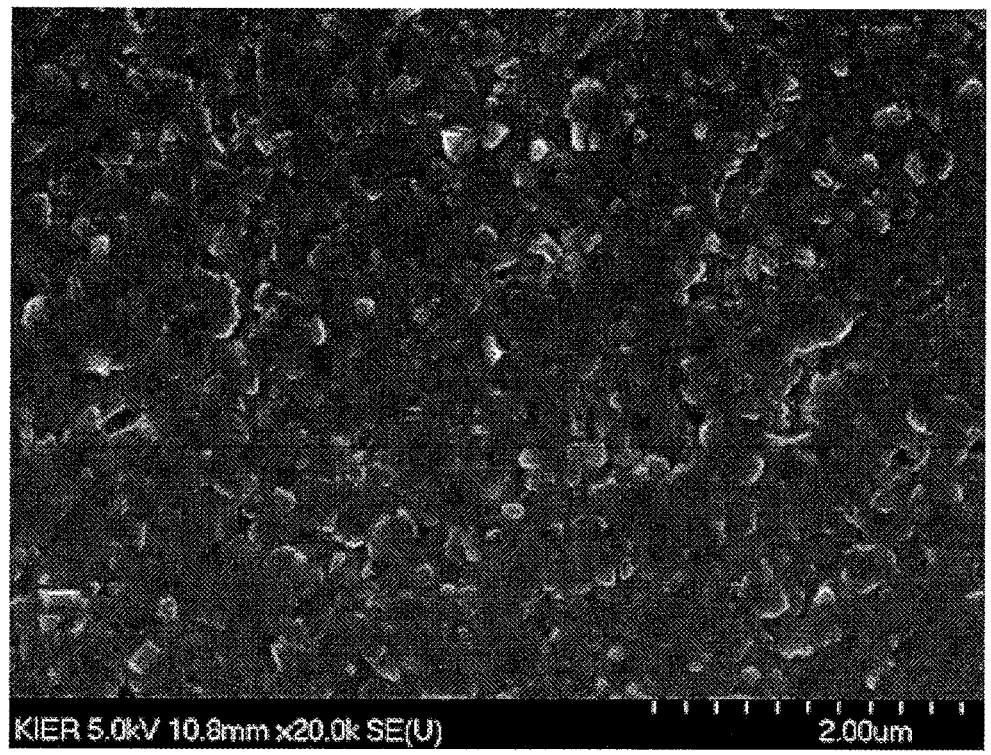
FIG. 5 is a surface image illustrating the results of sequential radiation of long-wavelength light and short-wavelength light on the CIGS precursor layer formed using a non-vacuum process.
Figure 6:
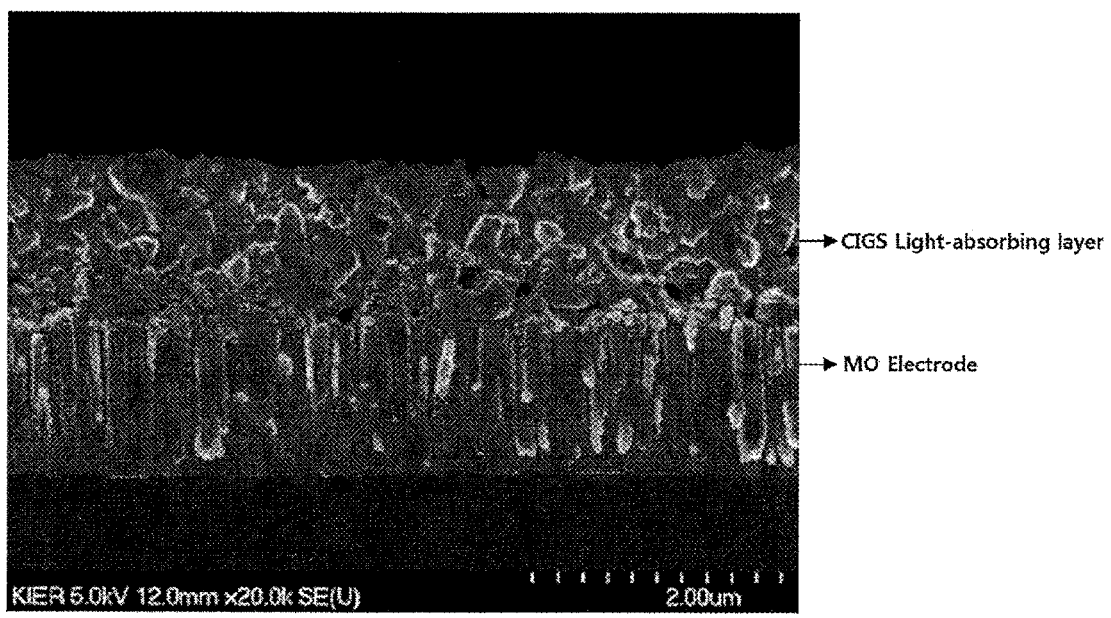
FIG. 6 is a cross-sectional image illustrating the results of sequential radiation of long-wavelength light and short-wavelength light on the CIGS precursor layer formed using a non-vacuum process.

FIGS. 5 and 6 are respective images of the surface and the cross-section of the GIGS precursor layer formed using a non-vacuum process, on which the long-wavelength light and the short-wavelength light are sequentially radiated.

As illustrated in the surface image of FIG. 5, when the long-wavelength light and the short-wavelength light were sequentially radiated, the surface of the CIGS precursor layer was crystallized. In particular, the crystal size was small and the surface roughness was relatively low, compared to FIG. 3.

As illustrated in the cross-sectional image of FIG. 6, the CIGS precursor layer was completely crystallized, thus forming a single layer. Based on the results of analysis of components thereof, the CIGS light-absorbing layer was formed.

As the long-wavelength light penetrated the CIGS precursor layer more deeply than the short-wavelength light, sufficient crystallization could occur even in the lower portion of the CIGS precursor layer, after which the short-wavelength light was radiated thereon, thereby forming the CIGS light-absorbing layer from the entire CIGS precursor layer, without the formation of $MoSe_2$ due to heating of the Mo electrode, by the deeply penetrated long-wavelength light.

Furthermore, the periods of time required to radiate the long-wavelength light and the short-wavelength light were adjusted depending on the thickness of the CIGS precursor layer, thereby forming the CIGS light-absorbing layer from the entire CIGS precursor layer, without problems related to heating of the Mo electrode, by the long-wavelength light.

The formation of the CIGS light-absorbing layer by radiating light on the CIGS precursor layer obtained using the precursor slurry in the non-vacuum process is illustratively described as above, and may be applied to a CIGS precursor layer formed using another non-vacuum process, or a CIGS precursor layer formed using co-evaporation or sputtering as a vacuum process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, it will be understood that the scope of the present invention is determined not by specific embodiments but by the following claims, and that all the technical ideas within the range equivalent thereto are incorporated in the scope of the present invention.

What is claimed is:

1. A method of forming a chalcopyrite light-absorbing layer for a solar cell, comprising:
    forming a thin film including a chalcopyrite compound precursor on a Mo rear electrode; and
    radiating light on the thin film,
    wherein the chalcopyrite compound precursor absorbs light energy and is thus crystallized, and wherein in the radiating the light, two or more light rays having different wavelength ranges are sequentially radiated from a relatively long wavelength to a relatively short wavelength.

2. The method of claim 1,
    wherein the forming the thin film including a chalcopyrite compound precursor is performed by applying a solution or slurry including a chalcopyrite compound precursor in a non-vacuum.

3. The method of claim 1, wherein the light rays have a wavelength in a range from infrared light to ultraviolet light.

4. The method of claim 1, wherein the radiating the light is performed in a Se or $H_2Se$ gas atmosphere.

5. The method of claim 1 wherein the method is free from applying heat.

6. A method of forming a chalcopyrite light-absorbing layer for a solar cell, comprising:
    forming a chalcopyrite precursor thin film on a Mo rear electrode; and
    radiating light on the chalcopyrite precursor thin film,
    wherein the chalcopyrite precursor thin film absorbs light energy and is thus crystallized, and wherein in the radiating the light, two or more light rays having different wavelength ranges are sequentially radiated from a relatively long wavelength to a relatively short wavelength.

7. The method of claim 6,
    wherein the forming the chalcopyrite precursor thin film is performed by using sputtering or co-evaporating elements for a chalcopyrite compound.

8. The method of claim 6, wherein the light rays have a wavelength in a range from infrared light to ultraviolet light.

9. The method of claim 6, wherein the radiating the light is performed in a Se or $H_2Se$ gas atmosphere.

10. The method of claim 6 wherein the method is free from applying heat.

* * * * *